United States Patent
Nishii et al.

(10) Patent No.: US 6,424,560 B2
(45) Date of Patent: Jul. 23, 2002

(54) SEMICONDUCTOR INTEGRATED CIRCUIT DEVICE AND INFORMATION PROCESSING DEVICE EMPLOYING SEMICONDUCTOR INTEGRATED CIRCUIT DEVICE

(75) Inventors: Osamu Nishii, Inagi; Motonobu Tonomura, Kodaira; Takanobu Tsunoda, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 55 days.

(21) Appl. No.: 09/824,232

(22) Filed: Apr. 3, 2001

(30) Foreign Application Priority Data

Jul. 4, 2000 (JP) ........................................ 2000-206861

(51) Int. Cl.[7] .............................................. G11C 11/00
(52) U.S. Cl. ..................... 365/154; 365/49; 365/189.05; 365/189.09
(58) Field of Search ...................... 365/154, 49, 189.05, 365/189.09, 230.08, 190, 202

(56) References Cited

U.S. PATENT DOCUMENTS 4,538,243 A * 8/1985 Zehner ........................ 365/49

5,805,490 A 9/1998 Machida

OTHER PUBLICATIONS

Lee et al., "Address Addition and Decoding without Carry Propagation," IEICE Trans, Inf. & Syst., vol. E80–D, Jan. 1, 1997, pp. 98–100.

Ho et al., "A Process–Portable 64b Embedded Microprocessor with Graphics Extensions and a 3.6GB/S Interface," 2001 IEEE International Solid–State Circuitsd Conference, Feb. 5–7, 2001, pp. 234–235.

* cited by examiner

Primary Examiner—David Nelms
Assistant Examiner—David Lam
(74) Attorney, Agent, or Firm—Reed Smith LLP

(57) ABSTRACT

A small-area associative memory for association by a value resulted from addition, with reduced carry delay, is disclosed. Adjacent 1-bit memory values and a signal depending on adjacent 2 bits of addition-inputs are inputted into a CAM memory cell constructed using MOS transistors, and a hit line is pulled down or pulled up in accordance with the input values.

23 Claims, 9 Drawing Sheets

SEMICONDUCTOR INTEGRATED CIRCUIT DEVICE AND INFORMATION PROCESSING DEVICE EMPLOYING SEMICONDUCTOR INTEGRATED CIRCUIT DEVICE

PRIORITY TO FOREIGN APPLICATIONS

This application claims priority to Japanese Patent Application No. P2000-206861.

BACKGROUND OF THE INVENTION

1. Field of the Invention

The present invention relates to a semiconductor integrated circuit device and an information processing device using the semiconductor integrated circuit device, and more particularly, to an insulated-gate type semiconductor integrated circuit device having an associative memory function and an addition function, and an information processing device using the semiconductor integrated circuit device.

2. Description of the Background

A conventional technique related to an associative memory is disclosed in Neil Waste, Kamran Eshraghian: "Principles of CMOS VLSI Design—A System Perspective", Addison Wesley (June 1988), Page 351 (hereinbelow referred to as a "document 1").

A conventional technique related to circuitry for high-speed A+B=K judgment processing is disclosed in "Evaluation of A+B=K Conditions Without Carry Propagation", IEEE Trans. on Computers, Vol. 41, No. 11, pp. 1484–1487, Nov. 1992 (hereinbelow referred to as a "document 2").

A conventional technique related to circuitry for high-speed addition and address decoding is disclosed in "Address Addition and Decoding without Carry Propagation", IEICE Trans. (The Journal of the Institute of Electronics, Information and Communication Engineers), Inf. & Syst., Vol. E08-D, No. 1, pp. 98–100, January 1997 (hereinbelow referred to as a "document 3").

A conventional technique related to high-speed integrated adder and TLB (Translate Lookaside Buffer) circuit is disclosed in Japanese Published Unexamined Patent Application No. Hei 8-212789 (hereinbelow referred to as a "document 4").

The document 1 discloses that 1-bit memory portion of content-addressable memory (CAM) having a comparison function can be constructed with 2 P-channel MOS transistors and 7 N-channel MOS transistors. Note that the herein throughout P-channel MOS transistor will be abbreviated to PMOS, and N-channel MOS transistor, NMOS.

Further, the document 1 discloses supplying !DATA (! indicates logical invert, and DATA means comparison data given from the outside) to a BIT terminal of a memory cell and DATA to a !BIT terminal, and, if a mismatch in the comparison of those lines occurs, pulling down a MATCH line, i.e. a "hit line", to a low level. Further, plural bit comparison processing using this memory cell, i.e., processing to judge whether n-bit data inputted corresponds with n-bit data stored in the memory, is well known in the art. To perform plural bit comparison, the MATCH line is shared among plural bits.

Further, it is known that a TLB (Translation Lookaside Buffer, i.e., a memory for logical/physical address translation) computer can be constructed by accessing a RAM based on the result on a CAM hit line.

The document 2 discloses that in the case of judgment of equation A+B=K (where K is a fixed value signal, and A and B are input signals) in plural bits, carry propagation time is conventionally required in an adder. However, the carry propagation can be omitted in the adder by arrangement of logic circuits.

The document 3 discloses that in the case of address decoding on a word line of memory based on the result of addition between a first value and a second value, address decoding processing can be started without carry propagation time by using a circuit called FAC (Fast-Adder-Comparator). Note that, for this purpose, the algorithm in the document 2 is used.

The document 4 discloses that in case of searching a TLB with the result of addition between a first value and a second value, it is judged at a high speed whether or not the result of addition between the first and second values corresponds with a comparison value, by using the FAC. The high-speed processing is attained by reducing a part of carry propagation time in the adder. Note that, for this purpose, the algorithm in the document 2 is used.

The operation to search an associative memory with a value obtained by addition as search data is an example of processing that may be performed in a MOS integrated circuit device. As a typical example, many computers perform processing to search an associative memory, such as a TLB, with a value obtained by adding two data values as an address.

If the technique disclosed in the document 4 is used in a case wherein the address obtained by addition is provided to the associative memory, it is determined whether the value corresponds with a value of comparison object, i.e., a memory value.

One difficulty that arises when the technique of document 4 is used in such a comparison application is that the number of transistors is large and the logic scale of the TLB circuit is large. For example, in a circuit in the document 4 at page 16 and FIG. 9, 1 inverter, 1 two-input AND gate, 1 two-input OR gate and 2 EOR gates are required per 1-bit memory cell of memory requiring association, i.e., per tag memory. In a general CMOS circuit, 1 inverter requires 2 transistors; 1 AND gate, 6 transistors; 1 OR gate, 6 transistors; and 1 EOR gate, 10 transistors. As a result, a total of 34 transistors are required per 1-bit memory cell. This is referred to as result 1.

In addition to the result 1, assuming that the memory bit length requiring 1-entry association is n, an n-input AND gate is required. As the n-input AND gate requires (2n+2) transistors for reasons apparent to those skilled in the art, about 2 transistors are required per 1-bit memory cell. This is referred to as result 2. As the result 1 and the result 2 are added to the 34 transistors, 36 transistors per 1-bit memory cell must be prepared, in addition to the memory circuit transistors.

It is known that a simple memory cell, without search function, can be constructed with 6 transistors, where the memory is a CMOS type SRAM (Static Random Access Memory). The number of transistors for the memory cell, where the technique disclosed in the document 4 is employed, is seven times the number of transistors in this simple SRAM. In the case of LSI, this greatly increases the LSI chip area.

A second difficulty is that n signal lines are required for signals to be inputted into the n-input AND gate, and, thus, a wire channel area for at least (n/2) signal lines is necessary in each of two entry directions of the memory. In the case of LSI, these wire channels also greatly increase the LSI chip area.

A third difficulty is that if a carry signal from a lower bit exists in a bit number of a tag portion in the associative memory, a RAM access word line through which an output from the associative memory is made to the RAM cannot be determined before the result of carry processing is obtained. Accordingly, high speed operation is limited.

As an example of a carry from a lower bit, in a case wherein A[31:0] is added to B[31:0], and it is determined whether a bit [31:12] resultant from the addition is equal to [31:12] in the associative memory, and a bit 11:0 is a lower bit, and a carry to a higher bit from this lower bit may result from the addition between A[11:0] and B[11:0].

A temporary added result A[31:12]+B[31:12], wherein attention is paid only to the bit 31:12, may be incremented (+1 to the bit 12 in this case) by the carry from the lower bit. In the document 4, as the output from the associative memory depends on the result of any carry from the lower bit, a RAM access word line through which the output from the associative memory is made to the RAM cannot be determined before the result of processing on the carry from lower bit is obtained. For this reason, the operation cannot be performed at a high speed.

Therefore, the need exists for a semiconductor integrated circuit device wherein, in a case of searching a TLB with the result of addition between a first value and a second value, it is determined at a high speed whether or not the result of addition corresponds with plural memory values, and the number of transistors and the need for large wire channels is correspondingly reduced.

SUMMARY OF THE INVENTION

Accordingly, an object of the present invention is to provide a semiconductor integrated circuit device wherein, in the case of searching a TLB with the result of addition between a first value and a second value, it is determined at a high speed whether or not the result of addition corresponds with plural memory values, and to provide an information processing device using this semiconductor integrated circuit device.

Another object of the present invention is to provide a semiconductor integrated circuit device having a construction to prevent an increase in the number of transistors needed in the case of searching a TLB with the result of addition between a first value and a second value, and to provide an information processing device using this semiconductor integrated circuit device.

Another object of the present invention is, in the case of searching a TLB with the result of addition between a first value and a second value, to determine at a high speed whether or not the result of addition corresponds with plural memory values, and, in the use of a conventionally-known method, to prevent increase in a wire channel area running along a memory entry direction.

Another object of the present invention is, in the case of searching a TLB with the result of addition between a first value and a second value, to determine at a high speed whether or not the result of addition corresponds with plural memory values, and, in the use of a conventionally-known method, to achieve a high speed operation that cannot be achieved, due to the fact that a RAM access word line through which an output to the RAM is made from the associative memory cannot be determined before the result of processing on a carry from a lower bit is obtained.

According to the present invention, to solve the above-described first and second difficulties, a wired AND or wired OR is provided for a common hit signal line covering plural bits on the entry, and the wired AND/OR signal is used to form a hit signal indicative of conformity/unconformity. Since the memory has a wired AND or wired OR, it can be regarded as a type of CAM (Content Addressable Memory).

Through the use this method, the minimum number of necessary transistors, in addition to the memory transistors, is 6. In one embodiment, in combination with a CMOS type memory cell constructed with 6 transistors, the memory cell can be realized with 12 transistors, including those of the memory cell and a comparator. Thus, the increase in the number of transistors used for conventionally-known methods can be prevented.

Further, as a wired AND or wired OR is used, the increase in wire channel area along the memory entry direction, which frequently occurs with the use of conventionally-known methods, can be suppressed. In the circuit as shown, a wire channel area necessary in the memory entry direction can be realized by the addition of 3 lines in comparison with a simple SRAM. Therefore, the wire channel area can be reduced versus the conventional connected minimum wire channel area for (n/2) lines.

Accordingly, the system of the present invention can be efficiently integrated in one semiconductor area or substrate. This is particularly applicable in a large-scale integration of an information processing device, such as a microprocessor.

For example, the semiconductor integrated circuit device according to one aspect of the present invention includes adjacent first and second memory cells provided on a surface of one semiconductor region, such as a substrate, and a hit line shared between both memory cells, wherein each memory cell has a static memory cell portion and a hit line voltage generating portion that determines a voltage of the hit line. The hit line voltage generating portion of the first memory cell is controlled by an output from the static memory cell portion of the second memory cell and an output from the static memory cell portion of the first memory cell. A large number of these memory cells, which operate in the same manner, are preferably arranged in matrix.

Additionally, in a preferred embodiment of the present invention, in order to solve the above-described third difficulty in a semiconductor associative memory integrated circuit device, outputs from a first hit line group, corresponding to a case wherein a carry from a lower bit is 0 as a result of the addition between a value of the first signal line and that of the second signal line, and a second hit line group, corresponding to a case wherein a carry from the lower bit is 1 as a result of addition between the value of the first signal line and that of the second signal line, are outputted from the semiconductor associative memory integrated circuit device to a second memory, such as a RAM. In the second memory, first data is read in accordance with the first hit line group, second data is read in accordance with the second hit line group, and one of the first data or the second data is selected in accordance with the results of the carry from the lower bit.

Other features and advantages of the present invention will be apparent from the following description taken in conjunction with the accompanying drawings.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical memory device and process. Those of ordinary skill in the art will recognize that other elements are desirable and/or required in order to implement the present invention. However, because such elements are well known in the art, and because they do not facilitate a better understanding of the present invention, a discussion of such elements is not provided herein. Preferred embodiments of the present invention will now be described in detail in accordance with the accompanying drawings. In the embodiments presented, data to be searched in the associative memory is n-bit data, wherein the least significant bit has a bit number s. That is, the data to be searched in the associative memory has a bit number [s+n−1:s].

Figure 1:
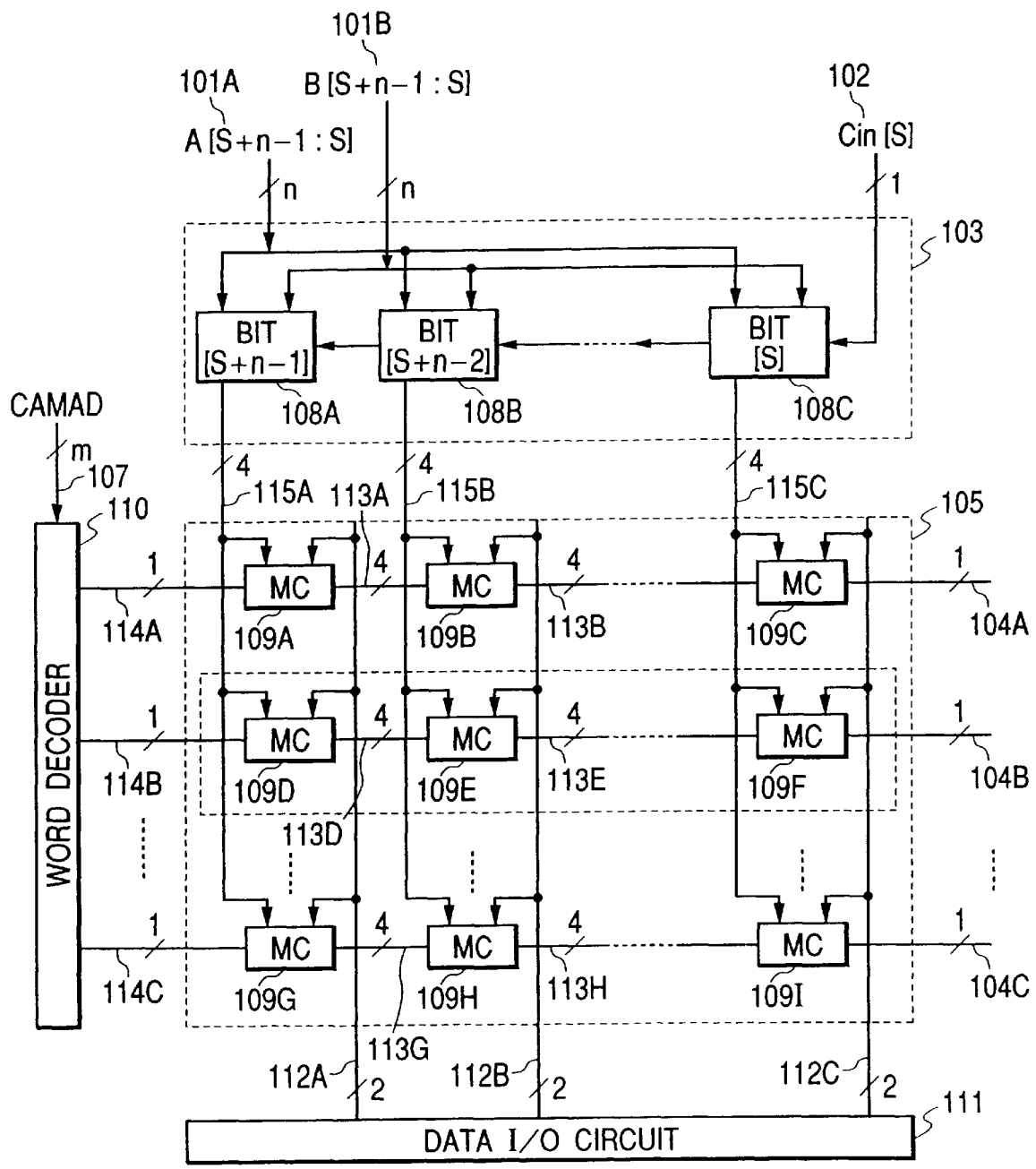
FIG. 1 is a circuit block diagram of associative memory according to an embodiment of the present invention.

FIG. 1 is a schematic diagram illustrating the construction of associative memory integrated in one semiconductor area. In FIG. 1, numerals 101A and 101B denote n-bit input signals having a bit number [s+n−1:s], and the input signals are to be added up. Numeral 102 denotes a carry input signal to the digit s.

Numeral 103 denotes a search data processing portion that processes the input signals 101A and 101B, and sends 4n signals to a memory portion. The search data processing portion comprises equivalent logic circuits 108A, 108B, . . . , 108C for respective bits. Numeral 105 denotes a memory mat having a matrix array of memory cells, each having 1-bit memory portion. Numeral 106 denotes one row of the memory mat along a direction, X (lateral direction in the figure), which is 1 entry of the associative memory. Numerals 109A, 109B, 109D, 109E, . . . , 109G and 109H denote 1-bit memory cells each having an associative function. Numerals 109C, 109F, . . . , 109I denote 1-bit memory cells, each having an associative function, as least significant bit (LSB) memory cells in the associative portion.

Numeral 110 denotes a word decoder that controls the word lines of the memory cells. The function of the word decoder 110 is known to those skilled in the art, and consequently an explanation of a word decoder is not provided herein. Numeral 107 denotes an m-bit address signal line for input to the word decoder 110. Numeral 111 denotes a data input/output circuit of the memory. The function of the data input/output circuit 111 is known to those skilled in the art, and consequently an explanation of a data input/output circuit is not provided herein.

Search data 115A to 115C are inputted into the memory mat from the search data processing portion 103. Address signals are inputted into the memory mat from the word decoder 110 via word lines 114A to 114C. Data transmission/reception is performed between the memory mat and the data input/output circuit 111 via data signal lines 112A to 112C. Search results are outputted to search result output lines 104A to 104C.

According to FIG. 1, the signal lines 115A to 115C and 112A to 112C in a direction Y (vertical direction in the figure) respectively form the same signal node. Signal lines 113A, 113D, . . . , 113G, and 113B, 113E, . . . , 113H are signal lines connecting the memory portions in the direction X (the lateral direction in the figure). Signal nodes connect adjacent memory cells, such as the nodes at signal lines 113A and 113B, 113D and 113E, 113G and 113H.

Figure 2:
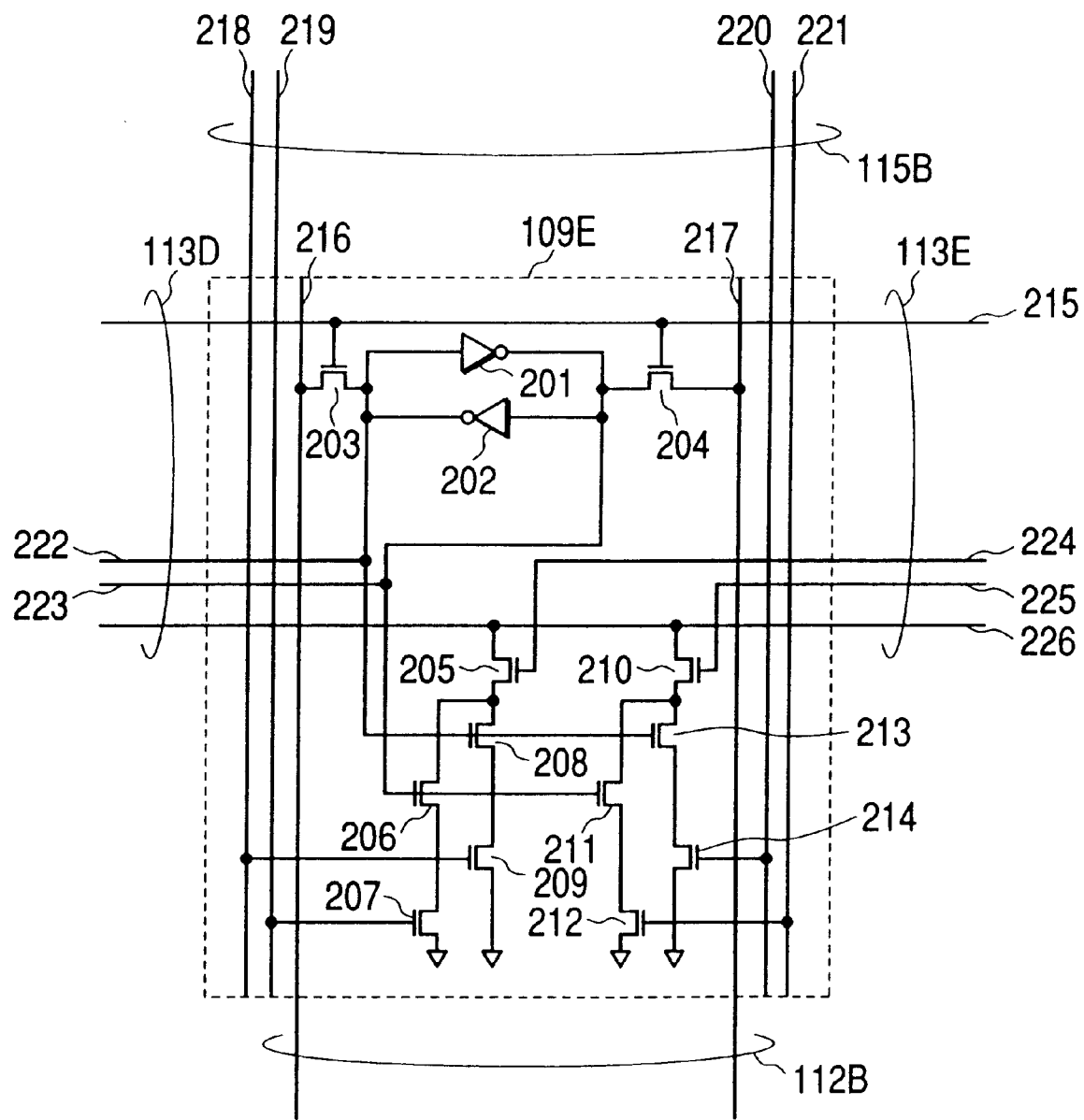
FIG. 2 is a circuit diagram of a memory cell.

FIG. 2 is a schematic diagram illustrating an example of the memory cell 109E. Note that the memory cell 109E preferably has the same construction as that of the memory cells 109A, 109B, 109D, 109G and 109H.

Numeral 109E denotes a circuit for 1 bit in the associative memory. In the memory cell 109E, numerals 201, 202, 203, and 204 denote devices constructing a static memory cell portion, including MOS transistors. Numerals 201 and 202 denote inverters (logic inversion devices; and 203 and 204, NMOSFETs. An inverter is constructed with 2 MOSFETs. Numeral 215 denotes a word line of the memory (corresponding to 114B in FIG. 1); and 216 and 217, a pair of data lines of the memory. It will be apparent to those skilled in the art that access can be made to the memory as an SRAM memory by using signals on the lines 215, 216, 217.

Numerals 218, 219, 220, 221 denote search data signal input lines corresponding to the signal line 115B in FIG. 1. Numerals 222 and 223 denote signal lines, connected to the output of the memory cell 109E, i.e., the output node of the static memory cell portion constructed with the MOSFETs 201, 202, 203, 204, for transmission (output) of a memory value to a left-side memory cell (corresponding to 109D in FIG. 1). The signal line 223 is in the relation of logical inversion from the signal line 222.

Further, numerals 224 and 225 denote signal lines, connected to the output of a right-side memory cell, i.e., the output node of the right-side static memory cell portion, for transmission (input) of memory value from the right-side memory cell to the memory cell 109E. Upon input of memory value of the right-side memory cell, the signal line 225 is in the relation of logical inversion from the signal line 224. Numeral 226 denotes a hit line, i.e. a match line. Accordingly, as it is understood from the figure, the memory cell 109E is connected to the left-side memory cell (109D) via the 4 signal lines 215, 222, 223 and 226. The signal line group corresponds to the signal line 113D in FIG. 1.

On the other hand, the memory cell 109E is connected to the right-side memory cell via the 4 signal lines 215, 224, 225 and 226. The signal line group corresponds to the signal line 113E in FIG. 1. Note that the signal lines 224 and 225 are connected to the output node of the right-side static memory cell portion. Further, the line 112B in FIG. 1, described hereinabove as a signal line connecting the memory mat 105 with the data input/output circuit 111, corresponds to the signal lines 216 and 217 in FIG. 2.

In the present embodiment, a first actuation path, i.e. a pull-down path, constructed with serially-connected NMOSFETs 210, 213 and 214 and NMOSFETs 210, 211 and 212, and a second pull-down path constructed with serially-connected NMOSFETs 205, 208 and 209 and NMOSFETs 205, 206 and 207, are provided on the hit line 226. An output signal from the memory cell 109E, i.e., an output signal from the static memory cell portion constructed with the MOSFETs 203 and 204, and an output signal from the static memory cell portion of the right-side memory cell, are applied to the gate electrodes of these MOSFETs.

Thus, the voltage of the hit line 226 is controlled by the output signal from the static memory cell portion constructing the memory cell and the output signal from the static memory cell portion of the right-side memory cell. The hit line 226 is effectively pulled down to a reference voltage of power voltage terminal upon a predetermined condition.

For example, in case of dynamic control, the hit line 226 is precharged to a high level prior to a search operation, and the search data input lines 218, 219, 220, 221 are set to a low level. When the search data lines 218, 219, 220, 221 are set to a low level, a pull-down current to the hit line 226 does not flow through the memory cell 109E. When the search operation is started, search data are supplied to the search data input lines 218, 219, 220, 221, and those lines may change to a high level. Note that the memory cell 109E having the construction in FIG. 2 is constructed with total 16 transistors. The number of MOSFETS is thus greatly reduced in the present invention in comparison with the number of MOSFETS in the above-described conventional memory cells.

Figure 3:
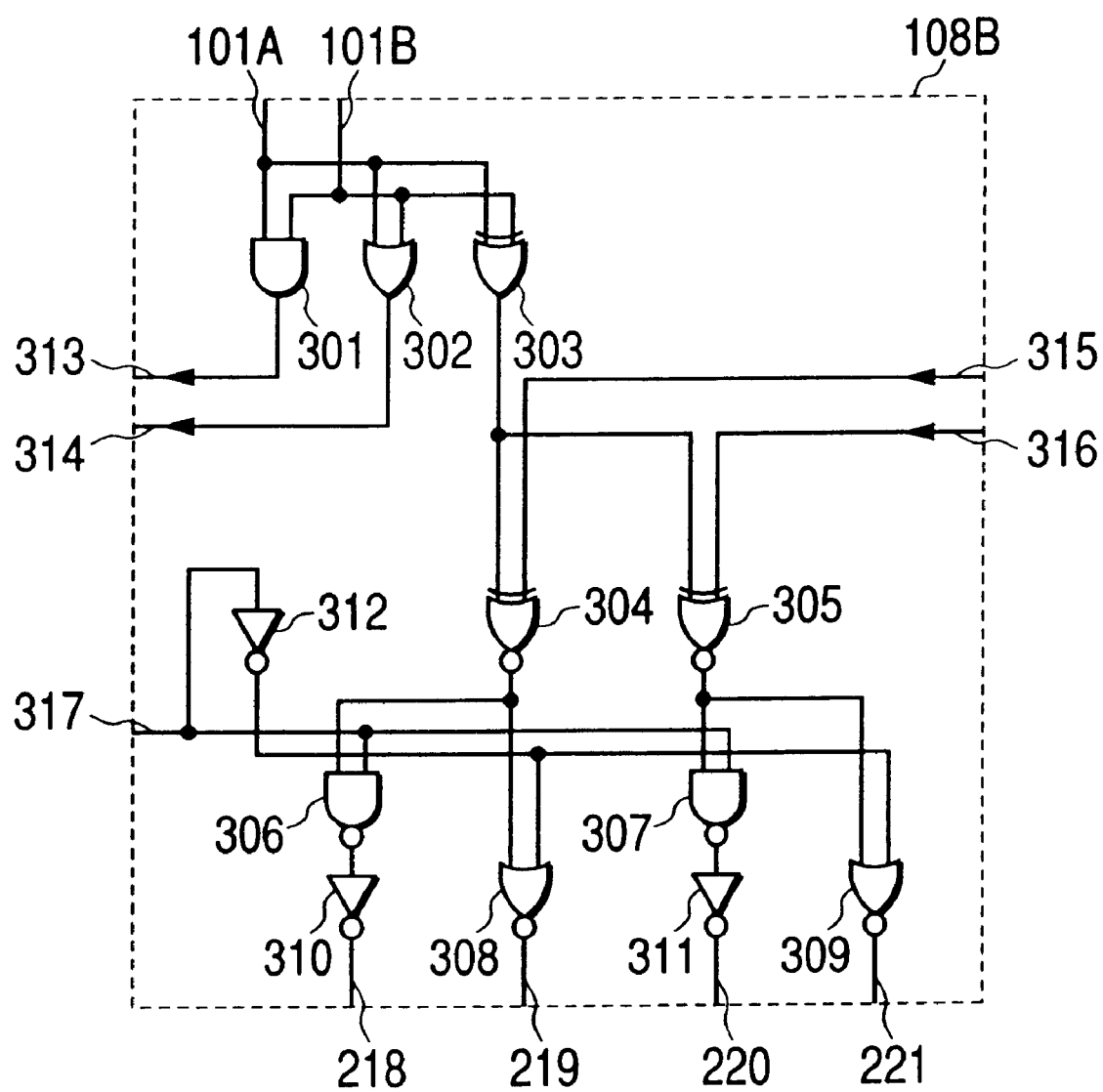
FIG. 3 is a circuit diagram of a search data generation logic circuit.

FIG. 3 is a schematic diagram illustrating the logic circuit 108B of FIG. 1, which generates search data. Note that the logic circuits 108A and 108B for respective bits preferably have the same construction.

Numeral 301 denotes a two-input AND gate which outputs the result of an AND between two input signals; 302, a two-input OR gate which outputs the result of an OR between two input signals; 303, a two-input EOR gate which outputs the result of an EXCLUSIVE-OR between two input signals; 304 and 305, two-input ENOR gates which output the result of an EXCLUSIVE-NOR between two input signals; 306 and 307, two-input NAND gates which output the result of a NAND between two input signals; 310 to 312, inverters; and 308 and 309, tow-input NOR gates which output the result of a NOR between two input signals.

Numerals 313 and 314 denote signal lines for transmission of outputs from the two-input AND gate 301 and the two-input OR gate 302 to a left-side logic circuit (108A in FIG. 1) which generates search data; 315 and 316, signal lines for reception of outputs from the two-input AND gate and the two-input OR gate of a right-side logic circuit (similar to the logic circuit 108B) which generates search data.

In the arrangement as shown in FIG. 3, the search data processing portion 103 is constructed by overlaying the logic circuit 108B, and connecting the terminal 313 to terminal 315 of the left-side circuit, and connecting the terminal 314 to the terminal 316 of the left-side circuit, and is represented as a dotted box in the direction X (lateral direction).

Numeral 317 denotes an association-enable signal line. When the association-enable signal line 317 is at a low level, the output signal lines 218, 219, 220, 221 are fixed to the low level. When the association-enable signal line 317 is at a high level, the output signal lines 218, 219, 220, 221 (corresponding to the signal line 115B in FIG. 1) function to effectively output the results of the combined logical operations from the circuits 101A and 101B and the signal lines 315 and 316.

Figure 4:
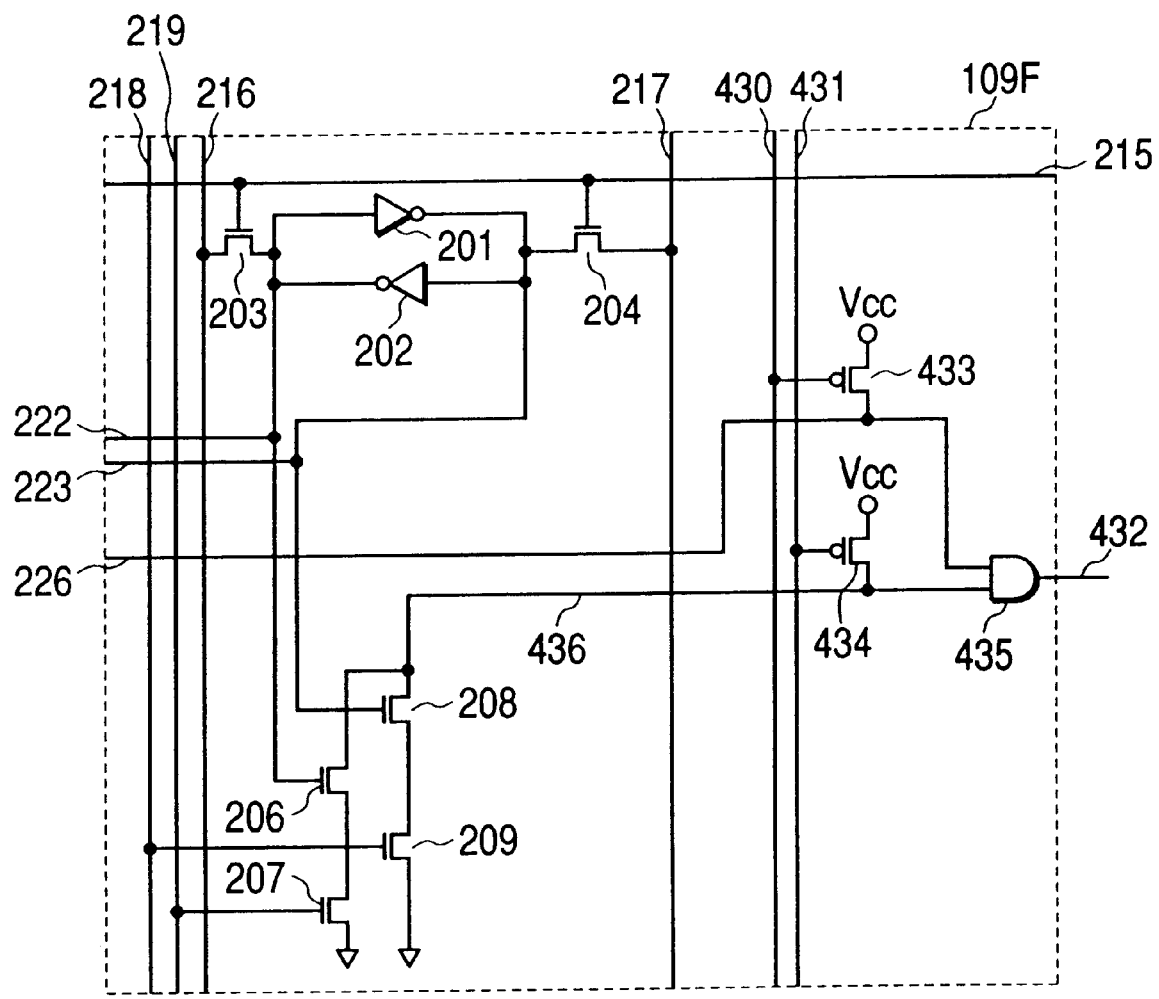
FIG. 4 is a circuit diagram of the memory cell in an LSB portion.

FIG. 4 is a schematic diagram illustrating the memory cell 109F in FIG. 1. Note that, in FIG. 4, the devices 201 to 204 and 206 to 209, and the signal lines 215 to 219 and 222 and 223, have the same functions as those described hereinabove with respect to FIG. 2, and therefore the explanations of the devices and signal lines will be omitted, and certain of the constituent elements not described in FIG. 2 will be described hereinbelow.

Numerals 430 and 431 denote precharge control signal lines; numeral 432, an association signal line; numeral 436, an LSB 1-bit hit line; numerals 433 and 434, precharge MOS transistors; and numeral 435, a two-input AND gate.

The precharge transistor 433, controlled by the precharge control signal line 430, actuates, i.e. pulls up, the hit line 226 to the high level. The precharge transistor 434, controlled by the precharge control signal line 431, has a function to pull up the LSB 1-bit hit line 436 to a high level. Further, the LSB 1-bit hit line 436 is pulled down by a circuit path formed with the NMOS transistors 206 to 209. That is, the output signal from the static memory cell portion and the search data input signal are applied to the gates of these transistors, and, upon a predetermined condition, the LSB 1-bit hit line 436 is effectively pulled down to the reference voltage of the power voltage terminal.

Next, the present embodiment will be described using the expressions in the document 2 hereinabove to facilitate understanding of the operations of the circuits in FIGS. 1 to 4.

The bit number of LSB to be compared is s, and the number of bits to be compared is n. The two values to be added are A={a[s+n−1], a[s+n−2], . . . , a[s]}
B={b[s+n−1], b[s+n−2], . . . , b[s]}Further, attention is paid only to 1 entry stored in the associative memory, and the entry memory value is
K={k[s+n−1], k[s+n−2], . . . , k[s]}The addition between A and B is A+B+cin[s], where cin[s] is the carry-in to the bit number s. The value of cin[s] can be obtained from the result of addition from bit (s−1) to bit 0.
x[i]=(a[i] eor b[i] enr (a[i−1]+b[i−1]) (i>s)
y[i]=(a[i] eor b[i] enr (a[i−1]*b[i−1]) (i>s) Regarding i=s,
x[s]=(a[s] eor b[s]) enr cin[s]
y[s]=(a[s] eor b[s]) enr cin[s] Document 2 proves that d satisfies the condition A+B+Cin[s]=K regarding a bit [n−1+s:s] (proof omitted herein), $$e[i] = x[i] \quad \text{(if } (k[i]k[i-1] = 00)$$
$$= y[i] \quad \text{(if } (k[i]K[i-1] = 01)$$
$$= !x[i] \quad \text{(if } (k[i]K[i-1] = 10)$$
$$= !y[i] \quad \text{(if } (k[i]K[i-1] = 11)$$

The above expression d can be applied to the signal line 432 as described hereinbelow. Note that it will be apparent to those skilled in the art that, regarding the precharge line, it is sufficient to consider the pull-down side by ratio or dynamic control. Further, by following the logic in FIG. 3, it should be noted that x[s−1], !x[s−1], y[s−1] and !y[s−1] are obtained on the search data signal lines 218, 219, 220, 221 when the association-enable signal line 217 is at the high level.

[Theorem 1]

The condition for pulling down the hit line 226 by a memory cell existing in a bit number i(i=n−1+s, n−2+s, . . . s+1) is !e[i].

(Proof)

x[i]=X, y[i]=Y, k[i]=L, and k[i−1]=M

As shown in FIG. 2, there are 4 current paths to pull down the hit line 226, respectively, for pulling down via !X!L!M, !Y!LM, XL!M, and YLM. Accordingly, the condition for pulling down the hit line 226 by a memory cell existing in the bit number i(i=n−1+s, n−2+s, . . . s+1) is !X!L!M+!Y!LM+XL!M+YLM. Regarding !e[i], $$
\begin{aligned}
!e[i] &= !x[i] && (\text{if } (k[i]k[i-1]) = 00) \\
&= !y[i] && (\text{if } (k[i]k[i-1]) = 01) \\
&= x[i] && (\text{if } (k[i]k[i-1]) = 10) \\
&= y[i] && (\text{if } (k[i]k[i-1]) = 11) \\
&= !X!L!M + !Y!LM + XL!M + YLM
\end{aligned}
$$

Accordingly, the above conditions are equal.

[Theorem 2]

The condition for pulling down the LSB hit line 436 is !e[s].

(Proof)

As shown in FIG. 4, there are 2 current paths to pull down the hit line 436, respectively, for pulling down via

!X!L, XL.

Accordingly, the condition for pulling down the hit line 436 is !X!L+XL. Regarding !e[s], as k[s−1]=0 holds, $$
\begin{aligned}
!e[s] &= !x[s] && (\text{if } (k[s]) = 0) \\
&= x[s] && (\text{if } (k[s]) = 1) \\
&= !X!L + XL
\end{aligned}
$$

Accordingly, the above conditions are equal.

As to the above theorems 1 and 2, the connection in FIG. 1, and the AND gate 435, and in light of the fact that when the hit line 226 is at the high level, it is not pulled down by any bit number memory cell connected to the line, the condition for setting the association signal line 432 to the high level is that the hit line is not pulled down by any memory cell existing in the bit number i(=n−1+s, n−2+s, . . . , s) connected to the line.

That is, the condition for setting the signal line 432 to the high level is $$
\begin{aligned}
&= !(!e[n-1+s]) * (!(!e[n-2+s]) * \cdots * (!e[s]) \\
&= d
\end{aligned}
$$

The association operation regarding the memory entry 106 is as described hereinabove, and is equally applicable to the other memory entries.

Figure 5:
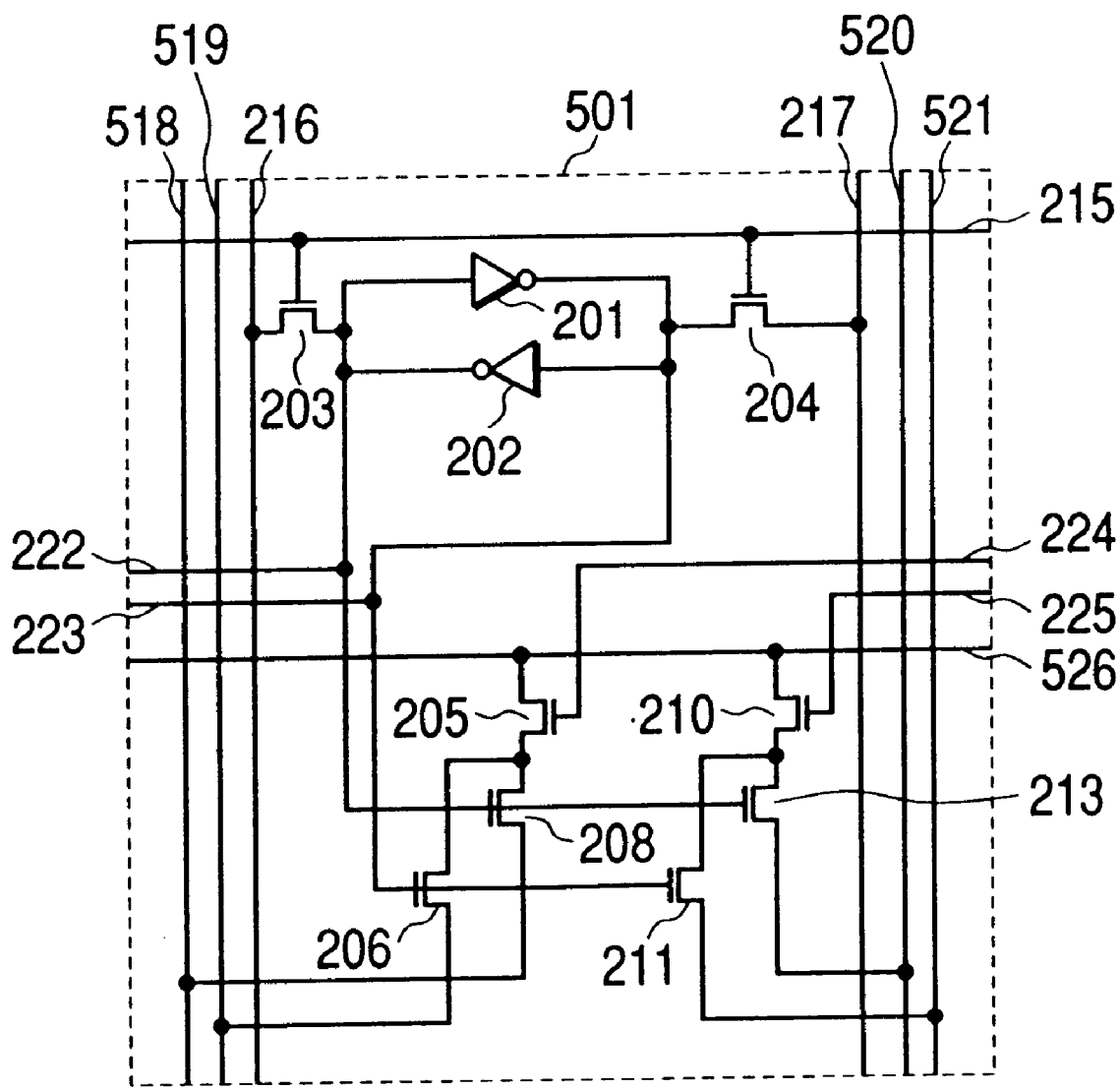
FIG. 5 is a circuit diagram of the memory cell according to a second embodiment of the present invention.

As is apparent from the description of the first embodiment, the present invention pulls down the hit line according to the condition !e[i] by a memory cell of the bit number i. FIG. 5 is a schematic diagram illustrating a second memory cell capable of this operation. The memory cell of FIG. 5 has 12 transistors. It will be noted that, in FIG. 5, several circuits correspond to the same or substantially similar circuits in FIG. 2.

Numeral 501 denotes a 1-bit memory cell. In FIG. 5, the devices 201 to 206, 208, 210 to 211, 213 to 217, and the signal lines 223 to 225 have substantially the same function as the correspondent devices and lines described hereinabove with respect to FIG. 2, and, therefore, explanations of these devices and signal lines will be omitted hereinbelow. Numeral 556 denotes a hit line.

Numerals 518, 519, 520, 521 denote search data input signal lines. An inverted signal from the signal of the signal line 218 is supplied to the signal line 518; an inverted signal from the signal of the signal line 219, to the signal line 519; an inverted signal from the signal of the signal line 220, to the signal lines 520; and an inverted signal from the signal of the signal line 221, to the signal line 521. Prior to a search operation, the hit line 526 is set to the high level, and the search data input signal lines 518 to 521 are set to a high level. At this time, the hit line 526 is not pulled down.

Upon a search operation, !X, X, !Y and Y defined in the proof of theorem 1 hereinabove are supplied to the search data input signal lines 518 to 521. Note that the method for constructing search data generation logic will be apparent from the description of FIG. 3 hereinabove. Upon a search operation, if the search data line is high, the hit line 526 is not pulled down, but, if the search data line is low, the hit line 526 is pulled down by the conductive condition of the serially-connected NMOS transistors connecting the search data line and the hit line. The pull-down condition is

!X!L!M+!Y!LM+XL!M+YLM

This is the same as the pull-down condition for the hit line 226 in FIG. 2, and, accordingly, it is apparent from the above description that the associative memory can be constructed in a similar manner to that in FIG. 1.

Figure 6:
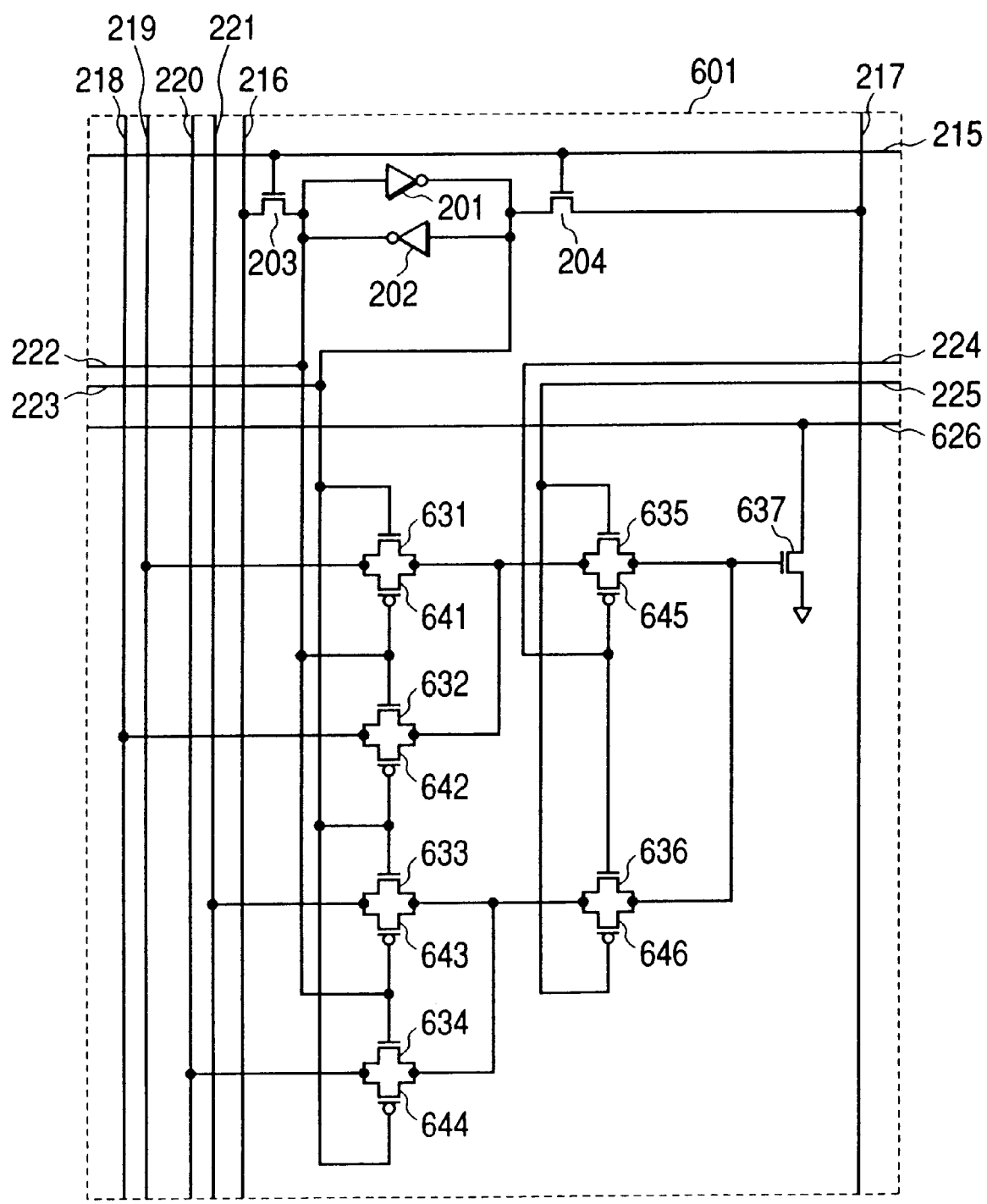
FIG. 6 is a circuit diagram of the memory cell according to a third embodiment of the present invention.

As is apparent from the description of the first embodiment, the present invention pulls down the hit line based on the condition !e[i] by a memory cell of the bit number i. FIG. 6 is a schematic diagram illustrating a memory cell capable of this operation.

In FIG. 6, numeral 601 denotes a memory cell. The memory cell 601 has 19 transistors. The number of necessary transistors is larger than that of the memory cells in FIGS. 2 and 5, but the speed of association in the circuit is higher than that of the memory cell in FIGS. 2 and 5. In the memory cell 601 capable of high speed operation, a single NMOS transistor is used in place of 3 serially-connected NMOS transistors to pull down the hit line. Further, as a single MOS transistor is used in place of 2 MOS transistors to connect the drain to the hit line, the total capacitive load on the hit line is lighter.

In FIG. 6, the devices 201 to 204 and signal lines 215 to 225 have substantially the same function as the equivalent elements described hereinabove with respect to FIG. 2, and, therefore, explanations of those devices and signal lines will be omitted. Numeral 626 denotes a hit line.

Numerals 631, 632, . . . , 637 denote NMOS's; and numerals 641, 642, . . . , 646, PMOS's. The hit line 626 is pulled down only by the single NMOS 637 in the memory cell 601. The pull-down condition is, gate voltage of the NMOS 637=High.

Note that, in the pull-down NMOS 637, plural MOS's such as NMOS's 631 to 636 and PMOS's 641 to 646 are connected to the gate electrode, and gate electrodes of the plural MOS's are connected to the output of the static memory cell portion and the output of the static memory cell portion of right-side memory cell, as in the case of the first embodiment hereinabove with respect to FIG. 1. Accordingly, the voltage of the hit line 626 is controlled by the output from the static memory cell portion and the output from the static memory cell portion of the side-side memory cell via the pull-down NMOS 637, as was the case in the first embodiment.

It will be apparent, by an examination of the connection of the NMOS's 631, 632, ..., 636 and 641, 642, ..., 646, that the gate voltage of the NMOS 637 is in conduction with exclusively one, and always one, of the search data input signal lines 218 to 221.

Prior to a search operation, the hit line 626 is set to the high level, and the search data input signal lines 218 to 221 are set to the low level. Under this condition, the hit line 626 is not pulled down.

Upon search operation, X, !X, Y, !Y defined in the proof of the theorem 1 are supplied to the search data input signal lines 218 to 221. As the conditions for conduction between the gate voltage of the NMOS 637 and the signal lines 218 to 221 are respectively L!M, !L!M, LM, !LM, the gate voltage of the NMOS 637 is !X!L!M+!Y!LM+XL!M+YLM, and the pull-down condition of the hit line 626 is

!X!L!M+!Y!LM+XL!M+YLM.

This is the same as the pull-down condition for the hit line 226 in FIG. 2, and, accordingly, it is apparent from the above description that the associative memory can be constructed in a similar manner to that in FIG. 1.

Figure 7:
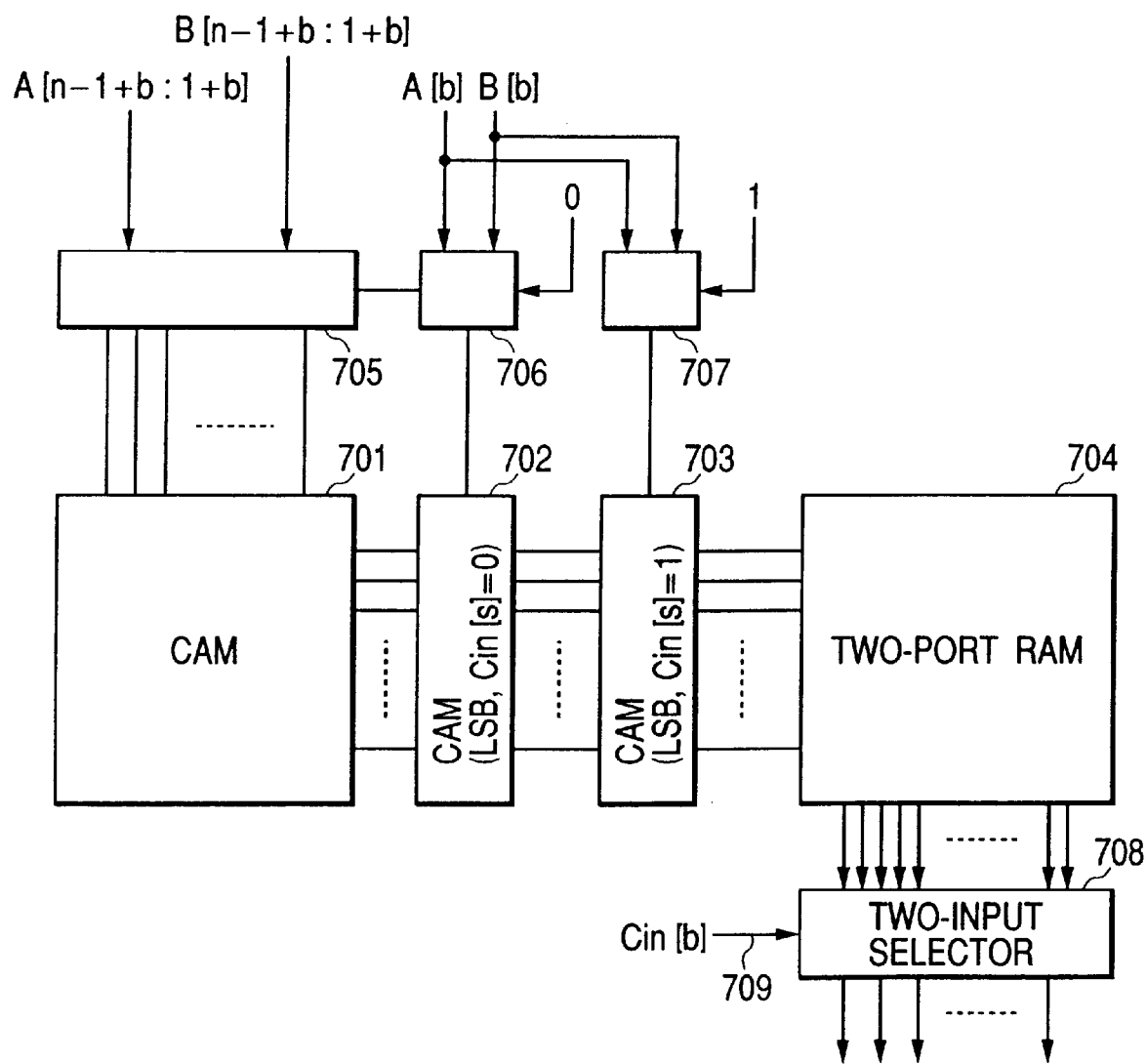
FIG. 7 is a block diagram of a circuit constructed with the associative memory and a two-port RAM, according to a fourth embodiment of the present invention.

FIG. 7 is a block diagram illustrating the associative memory using the memory cell in FIG. 6, and a RAM accessed in accordance with the result of association.

Numeral 701 denotes an associative memory using the memory cell 601 without a least significant bit, i.e., the bit (s); numeral 702, an associative memory for the least significant bit; numeral 703, an associative memory also for the least significant bit; and numeral 705, a search data processing logic circuit which can be realized by using the logic circuit 108A.

Numeral 706 denotes a search data processing logic circuit in which a terminal corresponding to the carry signal from lower bit cin[s] is fixed to 0, and thereby the search result output from the associative memory 702 is accepted prior to the determination of cin[s]. Numeral 707 denotes a search data processing logic circuit in which a terminal corresponding to the carry signal from lower bit cin[s] is fixed to 1, and thereby the search result output from the associative memory 702 is accepted prior to the determination of cin[s], as in the case of the logic circuit 706.

Numeral 704 denotes a two-port memory having two pairs of word lines. One port is accessed by the output from the associative memory 702, and the other port is accessed by the output from the associative memory 703. One of the two output data from the two-port memory 704 is selected by a two-input selector 708 in accordance with a cin[s] signal 709. By the selection, the associative memory and the result of RAM access in accordance with the result of association can be obtained.

By the above arrangement, the CAMs 701 to 703, and the two-port RAM 704, can be accessed without the determination of the cin[s] signal 709, and high speed processing can be performed.

Figure 8:
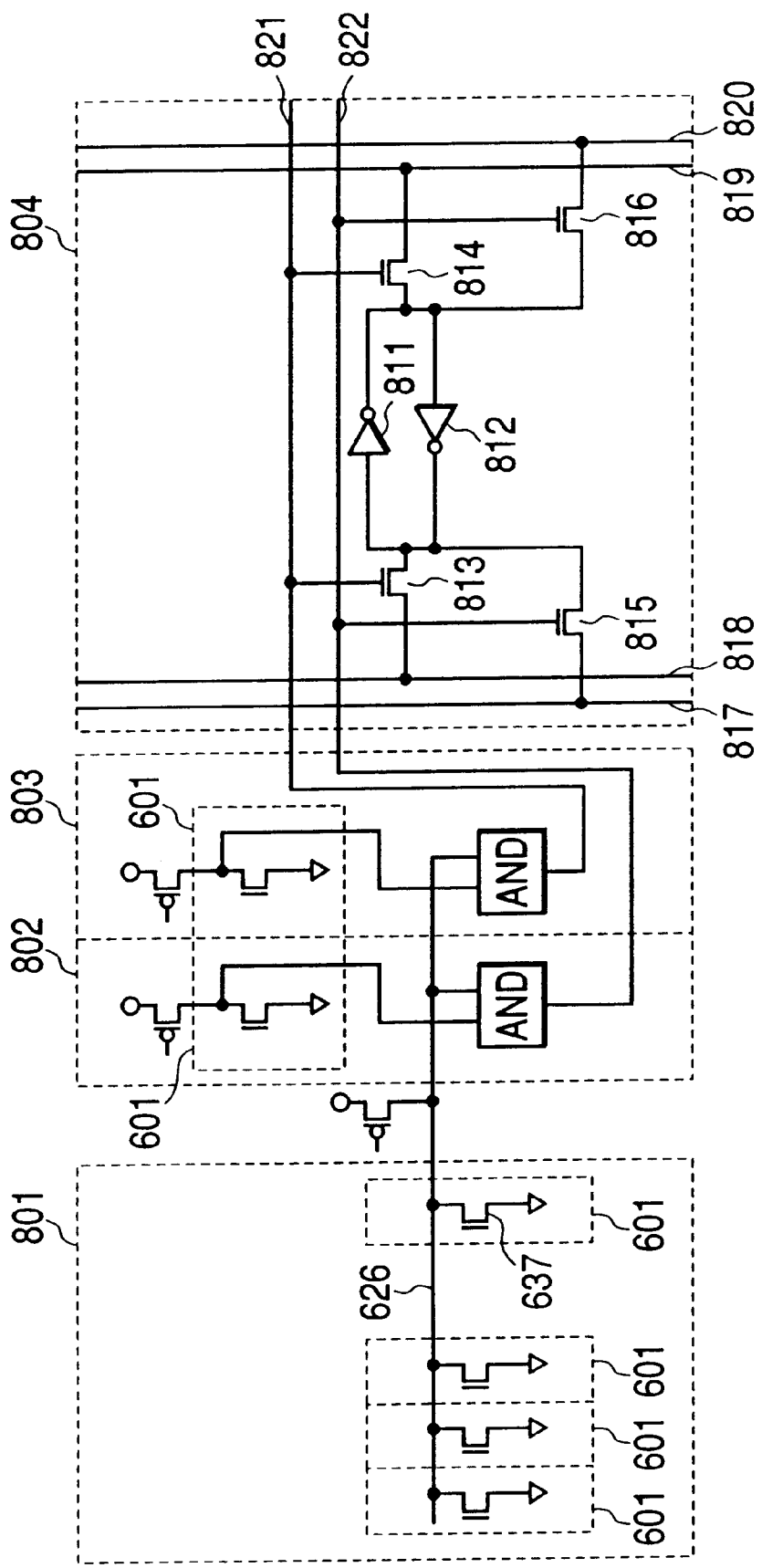
FIG. 8 is a circuit diagram explaining semiconductor construction of 1 entry portion in the fourth embodiment.

FIG. 8 is a block diagram illustrating the associative memory in FIG. 7 and 1 entry of the memory, wherein the memory is preferably in a semiconductor. Numeral 801 denotes 1 entry of the associative memory, wherein the memory is a group of 1-bit memory cells 601. As long as the operation of the hit line 626 is considered, only the pull-down transistor 637 is significant, and, therefore, only the pull-down transistor 637 is shown in the memory cell 601.

Numeral 802 denotes 1 entry of the associative memory in the LSB portion constructed with the memory cell 601 (only the transistor 637 is shown) corresponding to cin[s]=0 and an AND gate. By AND operation between a hit condition of bit [n−1+s:l+s] and a hit condition of bit [s], a hit condition of bit [n−1+s:s] is obtained. Further, this processing can be performed prior to the determination of cin[s]. Numeral 803 denotes 1 entry of the associative memory having the same construction as that of the entry 802, wherein cin[s]=0 is changed to cin[s]=1.

Numeral 804 denotes a two-port memory constructed with inverters 811 and 812, NMOS's 813 to 816, data lines 817 to 820, and word lines 821 and 822.

Figure 9:
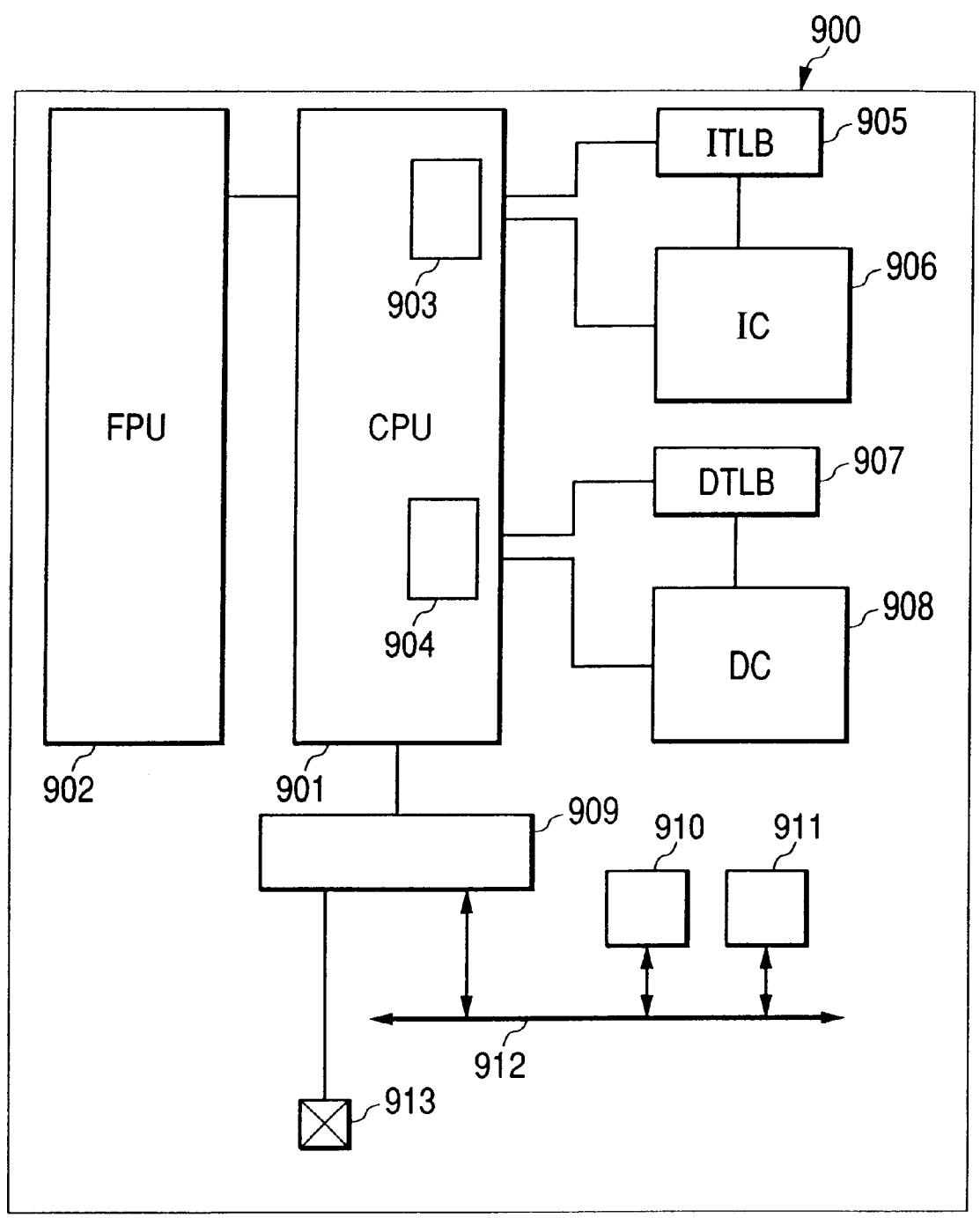
FIG. 9 is a block diagram of circuits integrated in a microprocessor LSI chip using the associative memory of the present invention.

FIG. 9 is a block diagram illustrating a variety of circuits incorporated in a microprocessor LSI chip 900 using the associative memory of FIG. 1. Numeral 901 denotes a CPU (Central Processing Unit). Further, numeral 901 also denotes an integer unit. Numeral 902 denotes an FPU (Floating Point Unit). Numeral 903 denotes an instruction address adder existing in the CPU 901. The instruction address adder 903 outputs an addition result as an instruction access address. Numeral 904 denotes a data address adder existing in the CPU 901.

Numeral 905 denotes an instruction TLB; numeral 906, an instruction cache; numeral 907, a data TLB; and numeral 908, a data cache. The instruction address adder 903 generates addresses to access the instruction TLB 905 and the instruction cache 906. For reduction of delay time, the high-speed adder and the associative memory described in FIG. 1 perform as the associatively-operating parts 903, 905 and 906.

Further, the data address adder 904 generates addresses to access the data TLB 907 and the data cache 908. Similarly, for reduction of delay time, the high-speed adder and the associative memory described in FIG. 1 perform as the associatively-operating parts 904, 907 and 908.

Numeral 909 denotes a bus interface; numeral 910, a timer unit as one of peripheral logic devices incorporated in the microprocessor LSI; numeral 911, a serial interface unit as one of the peripheral logic devices incorporated in the microprocessor LSI; numeral 912, a bus for peripheral logic devices; and numeral 913, a pin (terminal) for connection between the LSI and the outside environment.

In a case wherein the present invention is applied to an information processing device, such as a microprocessor, an area occupied by the functional parts 903, 905 and 906 and the functional parts 904, 907 and 908 in the chip can be reduced to about 2–4%, and, further, the processing speed of the information processing device, such as a microprocessor, can be improved. Accordingly, the entire system of the present invention can be efficiently integrated in one Si semiconductor substrate (chip).

It will be apparent to those skilled in the art, from the description of FIG. 9, that, in addition to the associative memory of FIG. 1, the associative memories of FIGS. 5 to 8, and the circuits constructing those associative memories, may perform in the system of FIG. 9. Further, it will be apparent that, although the voltage of the hit line is pulled down in the embodiments resented herein, the hit line may alternatively be pulled up in. Therefore, the detailed description of a pull-up operation for the present invention will be omitted.

As described hereinabove, in an associative memory accessed by the result of an addition, the memory cell may be constructed with a small number of transistors, while carry propagation delay in addition processing is simultaneously reduced. Further, in the associative memory accessed by the result of addition, the increase in wire channel area along the memory entry direction can be reduced to a small area, while the carry propagation delay in addition processing is reduced.

Additionally, in conventionally-known methods, the RAM access cannot be performed prior to the determination of carry generation signal from lower bit by a search object. However, in accordance with the present invention, RAM access can be performed prior to the determination of carry generation signal from a lower bit by a search object. Other advantages and benefits of the present invention will be apparent to those skilled in the art.

The present invention is not limited in scope to the embodiments discussed hereinabove. Various changes and modifications will be apparent to those skilled in the art, and such changes and modifications fall within the spirit and scope of the present invention. Therefore, the present invention is to be accorded the broadest scope consistent with the detailed description, the skill in the art and the following claims.

What is claimed is:

1. A semiconductor integrated circuit device, comprising:
a first memory cell comprising a first static memory cell portion and a hit line voltage generating portion;
a second memory cell provided adjacently to said first memory cell on a surface of one semiconductor region, wherein the second memory cell comprises a second static memory cell portion and a second hit line voltage generating portion; and
a hit line shared between said first memory cell and said second memory cell, wherein the hit line voltage generating portion determines a voltage of said hit line; and
wherein the hit line voltage generating portion is controlled by the first static memory cell portion and the second static memory cell portion.

2. The semiconductor integrated circuit device of claim 1, further comprising:
a third memory cell provided adjacently to said second memory cell on the surface of the one semiconductor region, wherein said third memory cell comprises a third static memory cell portion and a third hit line voltage generating portion, and wherein said third memory cell shares said hit line with said first memory cell and said second memory cell; and
wherein the second hit line voltage generating portion is controlled by the third static memory cell portion and the second static memory cell portion.

3. The semiconductor integrated circuit device of claim 1, wherein the hit line voltage generating portion is controlled by the first static memory cell portion and is directly controlled by the second static memory cell portion.

4. The semiconductor integrated circuit device of claim 1, wherein the hit line voltage generating portion is controlled by the first static memory cell portion and is indirectly controlled by the second static memory cell portion.

5. A semiconductor integrated circuit device, comprising:
a plurality of memory cells in a matrix on a surface of one semiconductor, wherein each of said plurality of memory cells comprises a static memory cell portion and a hit line voltage generating portion;
a word line shared among each of said plurality of memory cells;
a hit line shared among each of said plurality of memory cells; and
a data line shared among each of said plurality of memory cells;
wherein each of the plurality of static memory cell portions is connected to said word line and to said data line, and wherein each of the plurality of hit line voltage generating portions determines a voltage of said hit line, and wherein the hit line voltage generating portion in a given memory cell is controlled by the static memory cell portion in the given memory cell and by the static memory cell portion of an adjacent one of said plurality of memory cells.

6. The semiconductor integrated circuit device of claim 5, wherein said hit line is shared among each of said plurality of memory cells in a lateral direction, and wherein said plurality of memory cells share said hit line in rows of the matrix.

7. The semiconductor integrated circuit device of claim 6, wherein said data line is shared among each of said plurality of memory cells in a vertical direction, and wherein said plurality of memory cells share said data line in columns of the matrix.

8. The semiconductor integrated circuit device of claim 7, wherein said data line comprises an input and output data line.

9. A semiconductor associative memory integrated circuit device, comprising:
a first plural-bit signal input line that receives a fist value;
a second plural-bit signal input line that receives a second value;
a memory comprising plural-bit information for comparison with a plural-bit result of an addition between the first value and the second value; and
a wired signal line connected to each of a plurality of memory cells for each of a plurality of bit numbers within said memory;
wherein one memory cell of said plurality of memory cells, correspondent to a bit n, inputs a primary signal dependant on the bit n of said first signal line, the bit n of said second signal line, a first secondary bit of said first signal line, and a second secondary bit of said second signal line, and inputs a signal indicative of memory information in one of the plurality of memory cells correspondent to one of the inputted bits,
and wherein said wired signal line is actuated based on at least one condition dependent upon the primary signal, the value of the bit n of the one memory cell, and the signal indicative of memory information.

10. The semiconductor associative memory integrated circuit device of claim 9, wherein said wired signal line is selected from the group consisting of an OR gate and an AND gate.

11. The semiconductor associative memory integrated circuit device of claim 9, wherein said wired signal line is actuated by a pulling up.

12. The semiconductor associative memory integrated circuit device of claim 9, wherein said wired signal line is actuated by a pulling down.

13. The semiconductor associative memory integrated circuit device of claim 9, wherein the first secondary bit comprises a bit (n−1) of said first signal line, and wherein the second secondary bit comprises a bit (n−1) of said second signal line.

14. The semiconductor associative memory integrated circuit device of claim 13, wherein the signal indicative of memory information comprises a signal indicative of memory information of one of the memory cells of the secondary bits.

15. The semiconductor associative memory integrated circuit device of claim 9, wherein the first secondary bit comprises a bit (n+1) of said first signal line, and wherein the second secondary bit comprises a bit (n+1) of said second signal line.

16. The semiconductor associative memory integrated circuit device of claim 15, wherein the signal indicative of memory information comprises a signal indicative of memory information of one of the memory cells of the secondary bits.

17. The semiconductor associative memory integrated circuit device of claim 9, further comprising:
- a second memory accessed via a word line in accordance with a result of an association in the semiconductor associative memory integrated circuit device;
- wherein a first output from a first fit line group correspondent to a case wherein a carry from a lower bit is 0 as a result of the addition between the first value and the second value, and wherein a second output from a second hit line group correspondent to a case where a carry from a lower bit is 1 as a result of the addition between the first value and the second value, are outputted to said second memory,
- and wherein, within said second memory, a first data is read in accordance with the first output, a second data is read in accordance with the second output, and wherein one of the first data and the second data is selected in accordance with the carry from the lower bit.

18. The semiconductor associative memory integrated circuit device of claim 15, wherein said second memory comprises a two-port memory, having a second plurality of memory cells therein, wherein each of the memory cells includes two word lines and four data lines.

19. A semiconductor memory integrated circuit device, comprising:
- a memory unit comprising a hit line and a search data line shared between a 1-bit memory device and a plurality of memory cells;
- a first current path for actuating said hit line by at least first to tenth MOS transistors in accordance with one of said memory cells, wherein the actuating is sequentially from said hit line through said first MOS transistor, through said second MOS transistor, and through said third MOS transistor, to said search data line;
- a second current path for actuating said hit line sequentially from said hit line through said first MOS transistor, through said fourth MOS transistor, and though said fifth MOS transistor, to said search data line;
- a third current path for actuating said hit line sequentially from said hit line through said sixth MOS transistor, through said seventh MOS transistor, and through said eighth MOS transistor, to said search data line; and
- a fourth current path for actuating said hit line sequentially from said hit line through said sixth MOS transistor, through said ninth MOS transistor, and through said tenth MOS transistor, to said search data line.

20. The semiconductor memory integrated circuit device of claim 19, wherein each actuating is a pulling up.

21. The semiconductor memory integrated circuit device of claim 19, wherein each actuating is a pulling down.

22. A semiconductor memory integrated circuit device, comprising:
- a memory unit comprising a hit line and a search data line shared between a 1-bit memory device and a plurality of memory cells;
- a first current path for actuating said hit line by at least first to sixth MOS transistors in accordance with one of said memory cells sequentially from said hit line through said first MOS transistor, and through said second MOS transistor, to said search data line;
- a second current path for actuating said hit line sequentially from said hit line through said first MOS transistor, and through said third MOS transistor, to said search data line;
- a third current path for actuating said hit line sequentially from said hit line through said fourth MOS transistor, and through said fifth MOS transistor, to said search data line; and
- a fourth current path for actuating said hit line sequentially from said hit line through said fourth MOS transistor, and through said sixth MOS transistor, to said search data line.

23. An information processor, comprising:
- a central processing unit having an instruction address adder and a data address adder;
- an instruction TLB and an instruction cache cooperatively operated with said instruction address adder; and
- a data TLB and a data cache cooperatively operated with said data address adder,
- wherein said instruction address adder, said instruction TLB and said instruction cache, and said data address adder, said data TLB and said data cache perform an associative memory operation of a semiconductor associative memory integrated circuit device, wherein the semiconductor associative memory integrated circuit device comprises:
  - a first plural-bit signal input line that receives
- a fist value;
  - a second plural-bit signal input line that receives
- a second value;
  - a memory comprising plural-bit information for comparison with a plural-bit result of an addition between the first value and the second value; and
  - a wired signal line connected to each of a plurality of memory cells for each of a plurality of bit numbers within said memory;
  - wherein one memory cell of said plurality of memory cells, correspondent to a bit n, inputs a primary signal dependant on the bit n of said first signal line, the bit n of said second signal line, a first secondary bit of said first signal line, and a second secondary bit of said second signal line, and inputs a signal indicative of memory information in one of the plurality of memory cells correspondent to one of the inputted bits,
  - and wherein said wired signal line is actuated based on at least one condition dependant upon the primary signal, the value of the bit n of the one memory cell, and the signal indicative of memory information.

* * * * *